United States Patent
Lin et al.

(10) Patent No.: US 10,395,600 B2
(45) Date of Patent: Aug. 27, 2019

(54) INTEGRATED GATE DRIVER CIRCUIT

(71) Applicant: Apple Inc., Cupertino, CA (US)

(72) Inventors: Chin-Wei Lin, Cupertino, CA (US); Vasudha Gupta, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/711,706

(22) Filed: Sep. 21, 2017

(65) Prior Publication Data
US 2018/0108301 A1  Apr. 19, 2018

Related U.S. Application Data

(60) Provisional application No. 62/410,273, filed on Oct. 19, 2016.

(51) Int. Cl.
| | | |
|---|---|---|
| G09G 5/00 | (2006.01) | |
| G09G 3/3266 | (2016.01) | |
| G11C 19/18 | (2006.01) | |
| G11C 19/28 | (2006.01) | |

(52) U.S. Cl.
CPC ......... *G09G 3/3266* (2013.01); *G11C 19/182* (2013.01); *G11C 19/28* (2013.01); *G09G 2310/0251* (2013.01); *G09G 2310/0286* (2013.01); *G09G 2310/08* (2013.01)

(58) Field of Classification Search
CPC ... G09G 2310/0251; G09G 2310/0286; G09G 2310/0289; G09G 2310/08
See application file for complete search history.

(56) References Cited

U.S. PATENT DOCUMENTS

| | | | | |
|---|---|---|---|---|
| 2006/0290390 A1* | 12/2006 | Jang | ...................... | G11C 19/28 327/112 |
| 2008/0062112 A1* | 3/2008 | Umezaki | ................ | G09G 3/342 345/100 |
| 2014/0306947 A1* | 10/2014 | Miyamoto | ........... | H03K 17/162 345/212 |
| 2015/0042628 A1* | 2/2015 | Tseng | ................... | G09G 3/3677 345/205 |
| 2015/0262703 A1* | 9/2015 | Murakami | ............... | G09G 3/20 345/214 |
| 2015/0279480 A1* | 10/2015 | Murakami | ............... | G09G 3/20 345/100 |
| 2016/0063962 A1* | 3/2016 | Park | ..................... | G09G 3/3611 345/211 |
| 2016/0224175 A1* | 8/2016 | Moon | ................... | G06F 3/0412 |
| 2017/0110050 A1* | 4/2017 | Park | ..................... | G09G 3/3266 |
| 2017/0200418 A1* | 7/2017 | Zhang | ................... | G11C 19/28 |
| 2019/0012948 A1* | 1/2019 | Ohara | ................. | G09G 3/2003 |

* cited by examiner

*Primary Examiner* — Joe H Cheng
(74) *Attorney, Agent, or Firm* — Fletcher Yoder, P.C.

(57) ABSTRACT

A display device may include a plurality of rows of pixels configured to display image data on a display and a first gate driver circuit. The first gate driver circuit may couple a first voltage source to a first node associated with a first gate of a first switch upon receipt of a start signal or a gate signal from another gate driver circuit and couple a first clock signal to a first gate line via the first switch after a first voltage of the first node exceeds a threshold. The threshold is associated with activating the first switch, such that the first gate line is configured to couple to a first row of the plurality of rows of pixels. The first gate driver circuit may then couple a second voltage source to the first node based on a second clock signal, such that the second voltage source discharges the first node.

7 Claims, 13 Drawing Sheets

INTEGRATED GATE DRIVER CIRCUIT

CROSS-REFERENCE TO RELATED APPLICATIONS

This application claims the benefit of U.S. Provisional Application No. 62/410,273 entitled "Integrated Gate Driver Circuit" filed on Oct. 19, 2016, which is incorporated by reference herein its entirety for all purposes.

BACKGROUND

The present disclosure relates to systems and methods for providing gate signals to rows of pixels in an electronic display device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

As screen sizes, resolutions, and refresh rates for electronic displays increase, providing gate signals to each row of pixels of an electronic display may prove to be more challenging. That is, when providing a gate signal for a respective row of pixels, a gate driver circuit may have a limited amount of time to receive a clock signal used to output a respective gate signal. To ensure that the gate driver circuit is prepared to receive the rise and fall times of various clock signals for outputting respective gate signals for respective rows of pixels, the gate driver circuit may overlap gate enable signals (e.g., clock signals) used to output gate signals for the different rows of pixels. During a portion of this overlapped period, the gate driver circuit may pre-charge a gate of a respective switching circuit, such that the respective switching circuit is active prior to when a respective clock signal used to output the gate signal is received. By overlapping gate enable signals, the gate driver circuit may enable the display to depict image data for displays having larger screen sizes, higher resolutions, and faster refresh rates, as discuss above. However, to minimize the number of circuit components employed by the gate driver circuit to provide these overlapped enable gate signals (e.g., clock signals), improved systems and methods for operating a gate driver circuit are desirable.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In certain electronic display devices, light-emitting diodes such as organic light-emitting diodes (OLEDs), micro-LEDs (µLEDs), or active matrix organic light-emitting diodes (AMOLEDs) may be employed as pixels to depict image data for display. In some types of displays, a gate driver circuit may pre-charge a gate node of a switch (e.g., transistor) to activate (e.g., close) the switch prior to receiving a clock signal used to output a gate signal for a respective row of pixels. By pre-charging the gate node prior to when a corresponding clock signal is provided to the switch, the switch will be active in time to use the entire clock signal to output a corresponding gate signal. To effectively coordinate the manner in which a respective gate signal is provided to a respective row of pixels in the display, the gate driver circuit may employ a number of clocks to generate a number of clock signals for coordinating when each row of pixels is provided with a gate signal. As the resolution, the size, or the refresh rate of the display increases, additional clocks are used by the gate driver circuit to coordinate the gating of each row of pixels to display the image data. These additional clocks make the gating of the respective rows of the display more complex and add additional circuit components that consume additional power and take up additional space away from the respective electronic device that has the display.

In certain embodiments, to reduce the number of clocks and clock signals used by the gate driver circuit to depict image data, a gate driver circuit may receive the gate output associated with a previous row of pixels as a start signal to enable the respective gate driver circuit to begin pre-charging a respective gate node of a respective switch used to output the respective gate signal. That is, a clock previously used to provide a clock signal to initiate a pre-charge cycle for the gate node of a switch may be replaced by a gate signal of a previous row of pixels or another gate driver circuit used to provide the gate signal to the previous row of pixels. By using a gate signal from another gate driver circuit, a respective gate driver circuit may reduce the number of clocks used in its logic for coordinating the output of gate signals to a respective row of pixels.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Organic light-emitting diode (e.g., OLED, AMOLED) display panels provide opportunities to make thin, flexible, high-contrast, and color-rich electronic displays. Generally, OLED and AMOLED display devices depict image data via pixels that make up the display. The image data is provided to each pixel via voltage signals provided by a gate driver circuit and a source driver circuit. The gate driver circuit may provide a gate signal to thin-film-transistors (TFTs) along a row of pixels (or other group of pixels/sub-pixels) or the like to enable the TFTs of the respective row of pixels to receive pixel data (e.g., color and/or intensity values) for each pixel of the respective row of pixels. When the TFTs receive the gate signals, the source driver circuit may transmit pixel data to each pixel along the respective row of pixels, such that each pixel may be operated so that, in the aggregate a desired image is depicted.

In some embodiments, gate signals provided to two or more rows of pixels may overlap with each other, such that certain switches of the gate driver circuit may be pre-charged prior to receiving a clock signal that will cause the gate driver circuit to output a gate signal to the respective TFTs. To reduce the number of clocks used to keep the gate driver circuit driving each row of pixels, a gate output of a previous or adjacent gate driver circuit may be provided to a respective gate driver circuit to initiate the pre-charging of a gate of a switch that may assist in outputting the gate signal to the respective TFTs. Reducing the total number of clocks employed by the gate driver circuit provides for improved power consumption by the corresponding display device and less physical space occupied by the gate driver circuit. Additional details with regard to the systems and techniques involved with enabling the gate driver circuit to coordinate the output of gate signals to TFTs is detailed below with reference to FIGS. 1-15.

Figure 1:
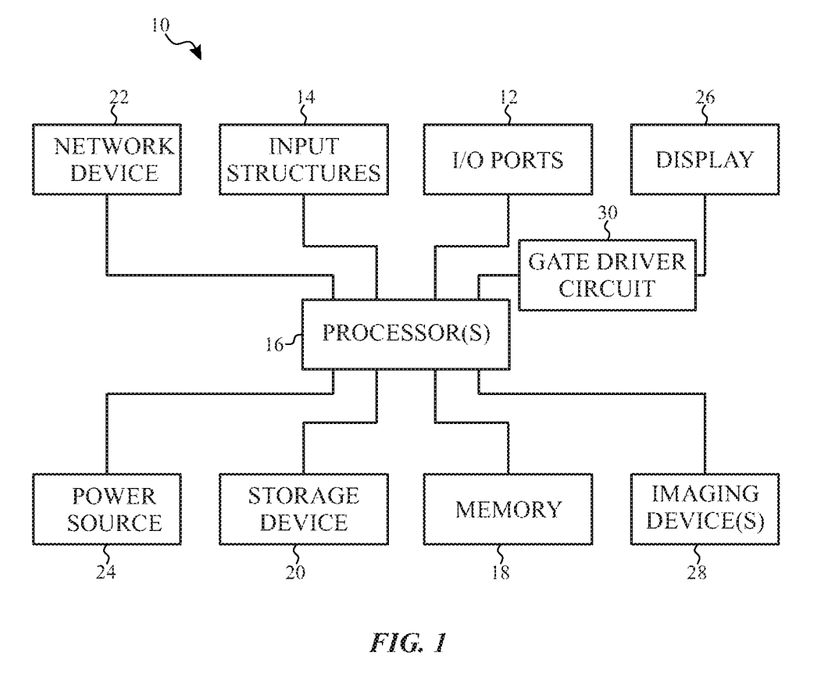
FIG. 1 is a simplified block diagram of components of an electronic device that may depict image data on a display, in accordance with embodiments described herein.

By way of introduction, FIG. 1 is a block diagram illustrating an example of an electronic device 10 that may include the gate driver circuit mentioned above. The electronic device 10 may be any suitable electronic device, such as a laptop or desktop computer, a mobile phone, a digital media player, television, or the like. By way of example, the electronic device 10 may be a portable electronic device, such as a model of an iPod® or iPhone®, available from Apple Inc. of Cupertino, Calif. The electronic device 10 may be a desktop or notebook computer, such as a model of a MacBook®, MacBook® Pro, MacBook Air®, iMac®, Mac® Mini, or Mac Pro®, available from Apple Inc. In other embodiments, electronic device 10 may be a model of an electronic device from another manufacturer.

As shown in FIG. 1, the electronic device 10 may include various components. The functional blocks shown in FIG. 1 may represent hardware elements (including circuitry), software elements (including code stored on a computer-readable medium) or a combination of both hardware and software elements. In the example of FIG. 1, the electronic device 10 includes input/output (I/O) ports 12, input structures 14, one or more processors 16, a memory 18, non-volatile storage 20, networking device 22, power source 24, display 26, and one or more imaging devices 28. It should be appreciated, however, that the components illustrated in FIG. 1 are provided only as an example. Other embodiments of the electronic device 10 may include more or fewer components. To provide one example, some embodiments of the electronic device 10 may not include the imaging device(s) 28.

Before continuing further, it should be noted that the system block diagram of the device 10 shown in FIG. 1 is intended to be a high-level control diagram depicting various components that may be included in such a device 10. That is, the connection lines between each individual component shown in FIG. 1 may not necessarily represent paths or directions through which data flows or is transmitted between various components of the device 10. Indeed, as discussed below, the depicted processor(s) 16 may, in some embodiments, include multiple processors, such as a main processor (e.g., CPU), and dedicated image and/or video processors. In such embodiments, the processing of image data may be primarily handled by these dedicated processors, thus effectively offloading such tasks from a main processor (CPU).

Considering each of the components of FIG. 1, the I/O ports 12 may represent ports to connect to a variety of devices, such as a power source, an audio output device, or other electronic devices. The input structures 14 may enable user input to the electronic device, and may include hardware keys, a touch-sensitive element of the display 26, and/or a microphone.

The processor(s) 16 may control the general operation of the device 10. For instance, the processor(s) 16 may execute an operating system, programs, user and application interfaces, and other functions of the electronic device 10. The processor(s) 16 may include one or more microprocessors and/or application-specific microprocessors (ASICs), or a combination of such processing components. For example, the processor(s) 16 may include one or more instruction set (e.g., RISC) processors, as well as graphics processors (GPU), video processors, audio processors and/or related chip sets. As may be appreciated, the processor(s) 16 may be coupled to one or more data buses for transferring data and instructions between various components of the device 10. In certain embodiments, the processor(s) 16 may provide the processing capability to execute an imaging applications on the electronic device 10, such as Photo Booth®, Aperture®, iPhoto®, Preview®, iMovie®, or Final Cut Pro® available from Apple Inc., or the "Camera" and/or "Photo" applications provided by Apple Inc. and available on some models of the iPhone®, iPod®, and iPad®.

A computer-readable medium, such as the memory 18 or the nonvolatile storage 20, may store the instructions or data to be processed by the processor(s) 16. The memory 18 may include any suitable memory device, such as random access memory (RAM) or read only memory (ROM). The nonvolatile storage 20 may include flash memory, a hard drive, or any other optical, magnetic, and/or solid-state storage media. The memory 18 and/or the nonvolatile storage 20 may store firmware, data files, image data, software programs and applications, and so forth.

The network device 22 may be a network controller or a network interface card (NIC), and may enable network communication over a local area network (LAN) (e.g., Wi-Fi), a personal area network (e.g., Bluetooth), and/or a wide area network (WAN) (e.g., a 3G or 4G data network). The power source 24 of the device 10 may include a Li-ion battery and/or a power supply unit (PSU) to draw power from an electrical outlet or an alternating-current (AC) power supply.

The display 26 may display various images generated by device 10, such as a GUI for an operating system or image data (including still images and video data). The display 26 may be any suitable type of display, such as a liquid crystal display (LCD), plasma display, or an organic light emitting diode (OLED) display, for example. In one embodiment, the display 26 may include self-emissive pixels such as organic light emitting diodes (OLEDs), micro-light-emitting-diodes (μ-LEDs), or active matrix organic light-emitting diodes (AMOLEDs).

Additionally, as mentioned above, the display 26 may include a touch-sensitive element that may represent an input structure 14 of the electronic device 10. The imaging device(s) 28 of the electronic device 10 may represent a digital camera that may acquire both still images and video. Each imaging device 28 may include a lens and an image sensor capture and convert light into electrical signals.

In certain embodiments, the electronic device 10 may include a gate driver circuit 30, which may include a chip, such as processor or ASIC, that may control various aspects of the display 26. For instance, the gate driver circuit 30 may use clock signals to coordinate when gate signals are provided to pixels of the display 26. Additional details with regard to the gate driver circuit 30 will be discussed below with reference to FIGS. 7-15.

Figure 2:
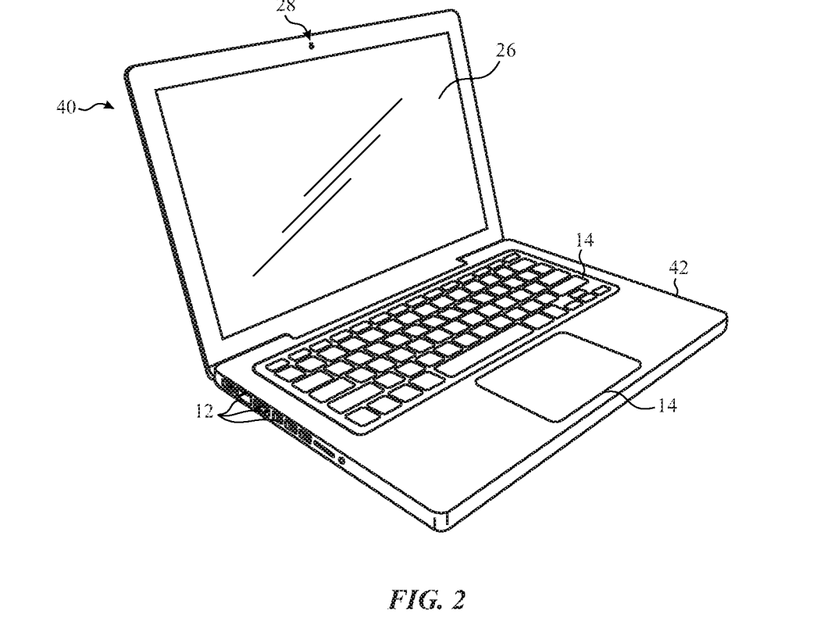
FIG. 2 is a perspective view of the electronic device of FIG. 1 in the form of a notebook computing device, in accordance with embodiments described herein.

As mentioned above, the electronic device 10 may take any number of suitable forms. Some examples of these possible forms appear in FIGS. 2-6. Turning to FIG. 2, a notebook computer 40 may include a housing 42, the display 26, the I/O ports 12, and the input structures 14. The input structures 14 may include a keyboard and a touchpad mouse that are integrated with the housing 42. Additionally, the input structure 14 may include various other buttons and/or switches which may be used to interact with the computer 40, such as to power on or start the computer, to operate a GUI or an application running on the computer 40, as well as adjust various other aspects relating to operation of the computer 40 (e.g., sound volume, display brightness, etc.). The computer 40 may also include various I/O ports 12 that provide for connectivity to additional devices, as discussed above, such as a FireWire® or USB port, a high definition multimedia interface (HDMI) port, or any other type of port that is suitable for connecting to an external device. Additionally, the computer 40 may include network connectivity (e.g., network device 22), memory (e.g., memory 18), and storage capabilities (e.g., storage device 20), as described above with respect to FIG. 1.

The notebook computer 40 may include an integrated imaging device 28 (e.g., a camera). In other embodiments, the notebook computer 40 may use an external camera (e.g., an external USB camera or a "webcam") connected to one or more of the I/O ports 12 instead of or in addition to the integrated imaging device 28. In certain embodiments, the depicted notebook computer 40 may be a model of a MacBook®, MacBook® Pro, MacBook Air®, or PowerBook® available from Apple Inc. In other embodiments, the computer 40 may be portable tablet computing device, such as a model of an iPad® from Apple Inc.

Figure 3:
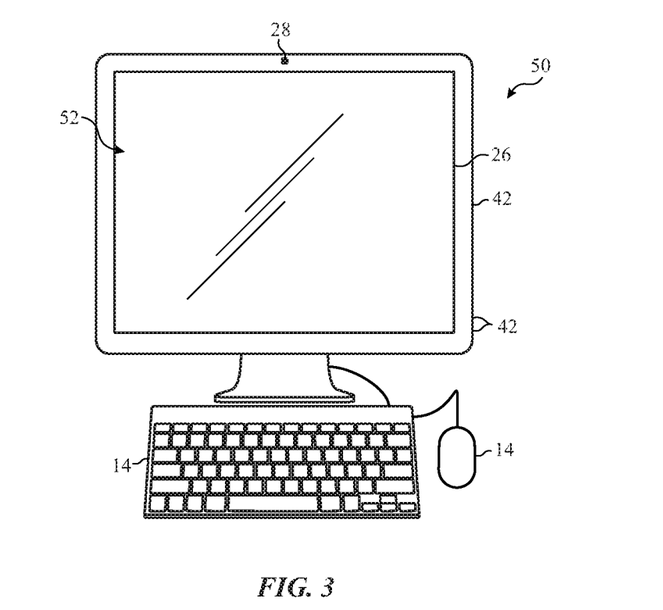
FIG. 3 is a front view of the electronic device of FIG. 1 in the form of a desktop computing device, in accordance with embodiments described herein.

FIG. 3 shows the electronic device 10 in the form of a desktop computer 50. The desktop computer 50 may include a number of features that may be generally similar to those provided by the notebook computer 40 shown in FIG. 4, but may have a generally larger overall form factor. As shown, the desktop computer 50 may be housed in an enclosure 42 that includes the display 26, as well as various other components discussed above with regard to the block diagram shown in FIG. 1. Further, the desktop computer 50 may include an external keyboard and mouse (input structures 14) that may be coupled to the computer 50 via one or more I/O ports 12 (e.g., USB) or may communicate with the computer 50 wirelessly (e.g., RF, Bluetooth, etc.). The desktop computer 50 also includes an imaging device 28, which may be an integrated or external camera, as discussed above. In certain embodiments, the depicted desktop computer 50 may be a model of an iMac®, Mac® mini, or Mac Pro®, available from Apple Inc.

Figure 4:
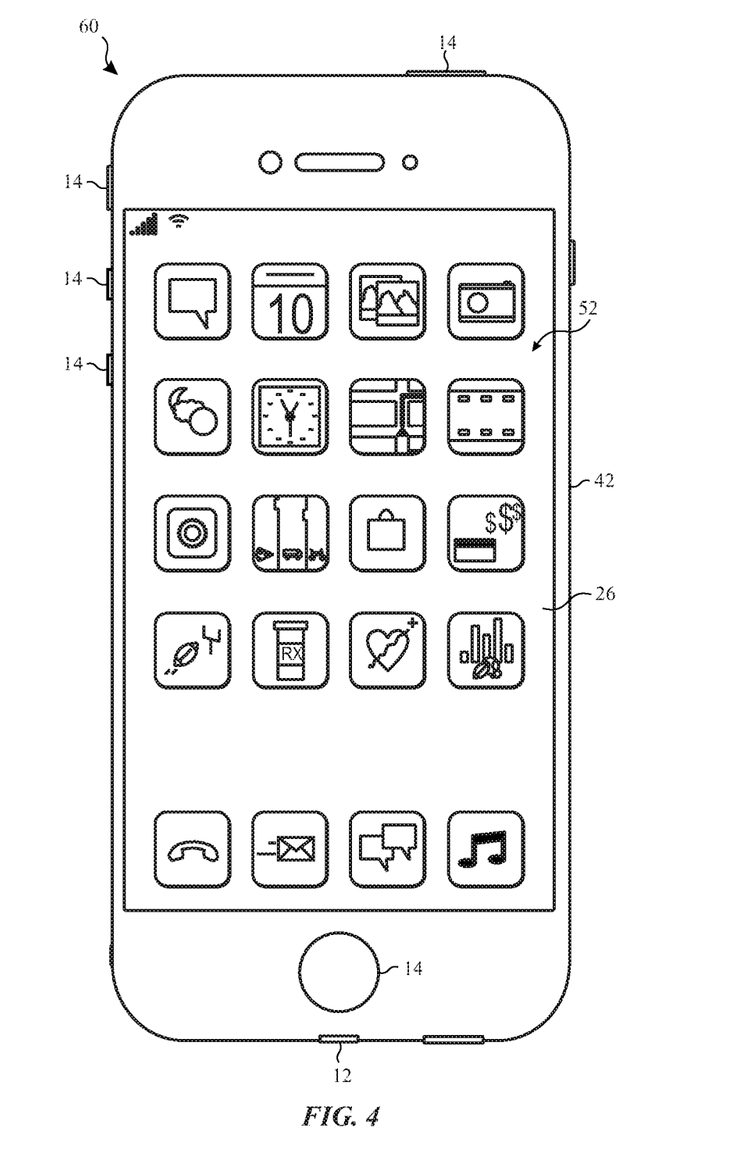
FIG. 4 is a front view of the electronic device of FIG. 1 in the form of a handheld portable electronic device, in accordance with embodiments described herein.
Figure 5:
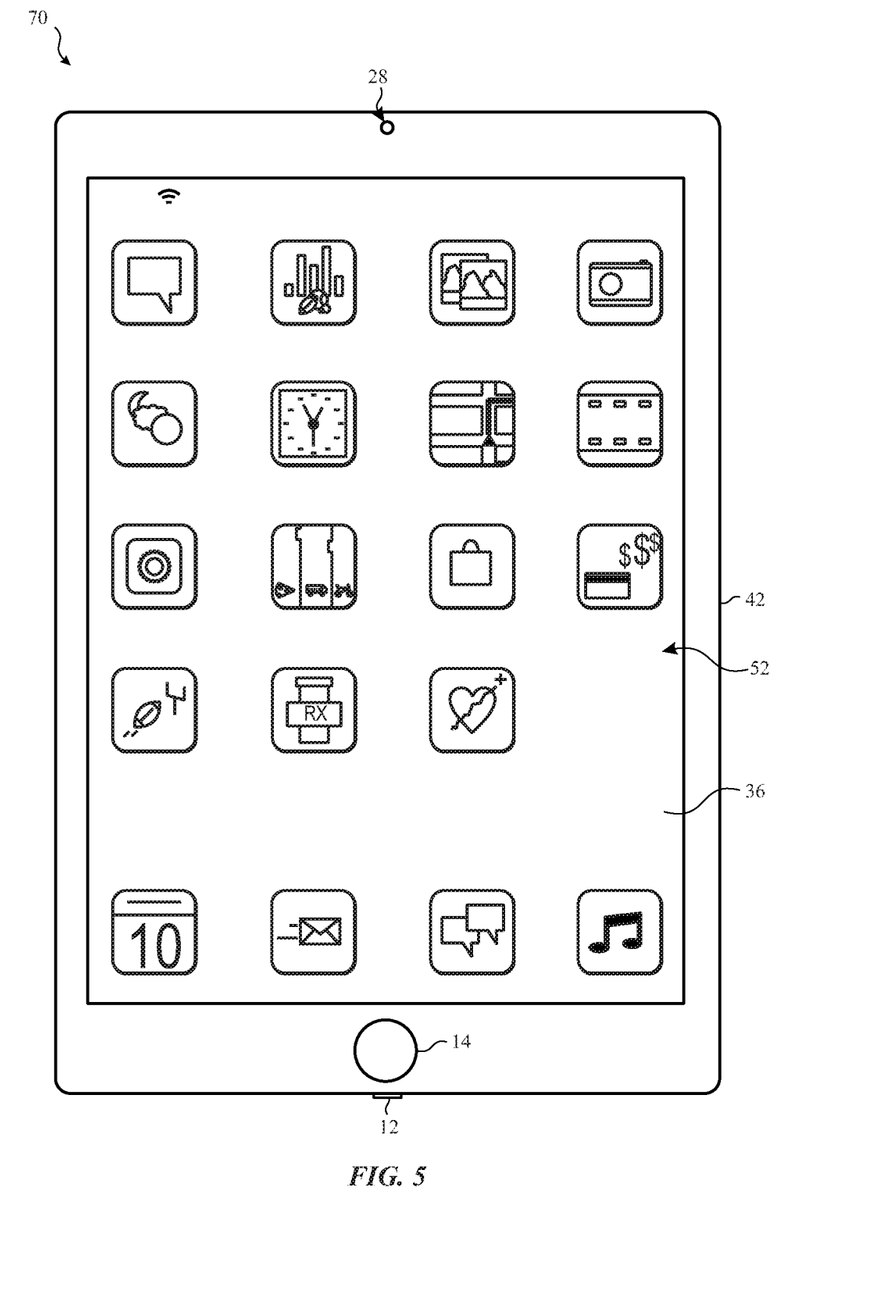
FIG. 5 is a front view of the electronic device of FIG. 1 in the form of a tablet computing device, in accordance with embodiments described herein.

The electronic device 10 may also take the form of portable handheld device 60 or 70, as shown in FIGS. 4 and 5. By way of example, the handheld device 60 or 70 may be a model of an iPod® or iPhone® available from Apple Inc. The handheld device 60 or 70 includes an enclosure 42, which may function to protect the interior components from physical damage and to shield them from electromagnetic interference. The enclosure 42 also includes various user input structures 14 through which a user may interface with the handheld device 60 or 70. Each input structure 14 may control various device functions when pressed or actuated. As shown in FIGS. 4 and 5, the handheld device 60 or 70 may also include various I/O ports 12. For instance, the depicted I/O ports 12 may include a proprietary connection port for transmitting and receiving data files or for charging a power source 24. Further, the I/O ports 12 may also be used to output voltage, current, and power to other connected devices.

Figure 6:
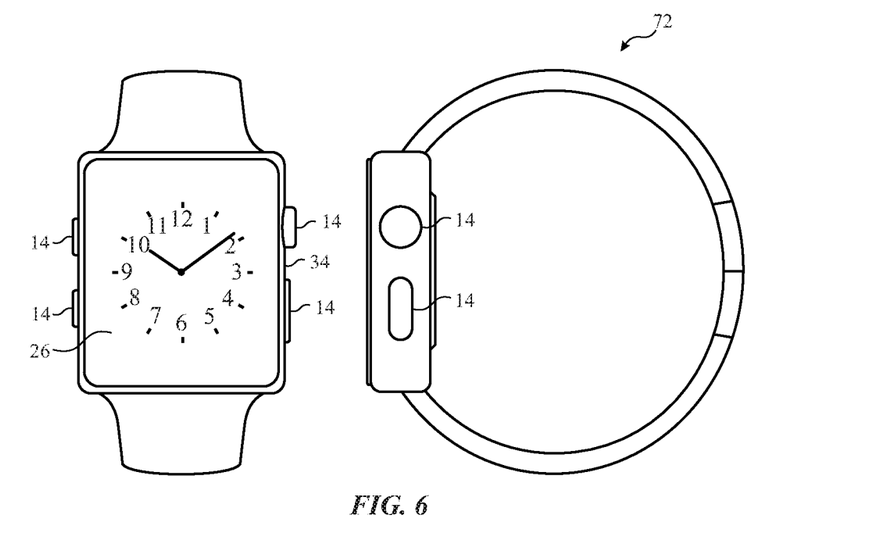
FIG. 6 is a front view of a wearable electronic device representing another example of the electronic device of FIG. 1, in accordance with embodiments described herein.

Another example of a suitable electronic device 10, specifically a watch 72, is shown in FIG. 6. For example, the watch may be any Apple Watch® model available from Apple Inc. The watch 72 may include a display 26, as described above.

The display 26 may display images generated by the handheld device 60 or 70. For example, the display 26 may display system indicators that may indicate device power status, signal strength, external device connections, and so forth. The display 26 may also display a GUI 52 that allows a user to interact with the device 60 or 70, as discussed above with reference to FIG. 3. The GUI 52 may include graphical elements, such as the icons, which may correspond to various applications that may be opened or executed upon detecting a user selection of a respective icon.

Figure 7:
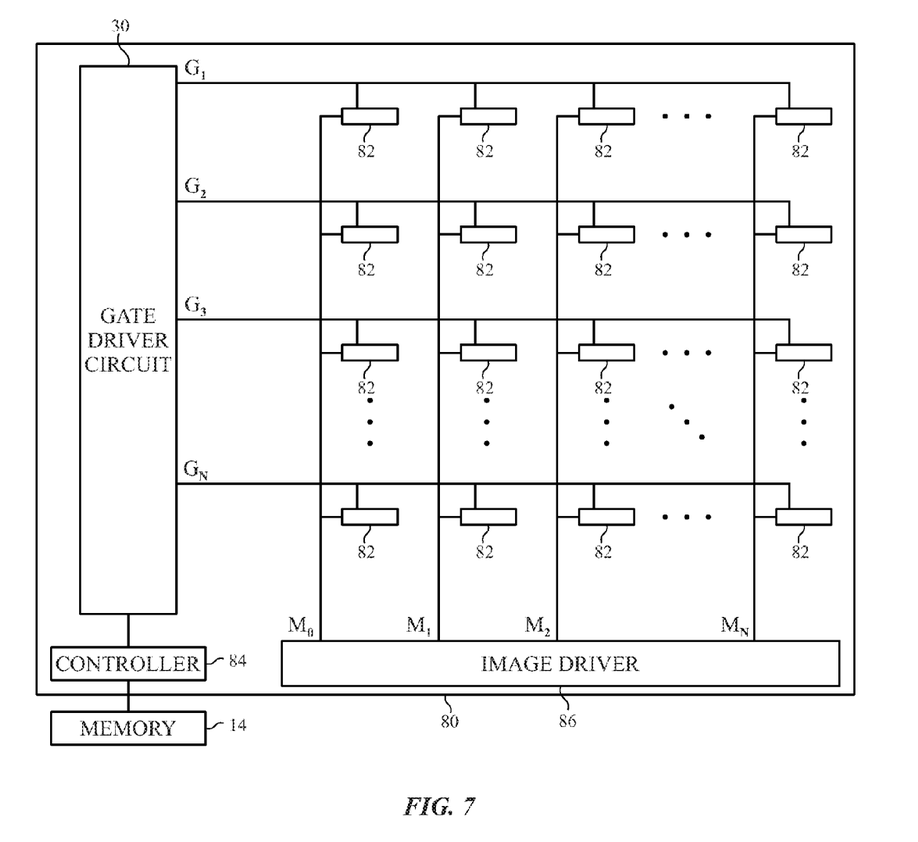
FIG. 7 is a circuit diagram of an array of self-emissive pixels of the electronic display of the electronic device of FIG. 1, in accordance with embodiments described herein.

Having provided some context with regard to possible forms that the electronic device 10 may take, the present discussion will now focus on the gate driver circuit 30 of FIG. 1. Generally, the brightness depicted by each respective pixel in the display 26 is controlled by varying an electric field associated with each respective pixel in the display 26. Keeping this in mind, FIG. 7 illustrates one embodiment of a circuit diagram of display 26 that may generate the electrical field that energizes each respective pixel and causes each respective pixel to emit light at an intensity corresponding to an applied voltage. As shown, display 26 may include a self-emissive pixel array 80 having an array of self-emissive pixels 82.

The self-emissive pixel array 80 is shown having a controller 84, the gate driver circuit 30, an image driver 86, and the array of self-emissive pixels 82. The self-emissive pixels 82 are driven by the gate driver circuit 30 and image driver circuit 86. In some embodiments, the gate driver circuit 30 and the image driver circuit 86 may include multiple channels for independently driving multiple self-emissive pixels 82. The self-emissive pixels 82 may include any suitable light-emitting elements, such as organic light emitting diodes (OLEDs), active matrix organic light-emitting diodes (AMOLEDs), micro-light-emitting-diodes (μ-LEDs), and the like.

The gate driver circuit 30 may be connected to the self-emissive pixels 82 by way of gate lines $G_0, G_1, \ldots G_{m-1}$, and $G_m$. The self-emissive pixels 82 receive on/off instructions through the gate lines $G_0, G_1, \ldots G_{m-1}$, and $G_m$. The driving currents are applied to each self-emissive pixel 82 to emit light according to instructions from the image driver circuit 86 through driving lines $M_0, M_1, \ldots M_{n-1}$, and $M_n$. Both the gate driver circuit 30 and the image driver circuit 86 transmit voltage signals through respective driving lines to operate each self-emissive pixel 82 at a state determined by the controller 84 to emit light. Each driver circuit may supply voltage signals at a duty cycle and/or amplitude sufficient to operate each self-emissive pixel 82. The controller 84 may control the color of the self-emissive pixels 82 using image data generated by the processor(s) 16 and stored into the memory 18 or provided directly from the processor(s) 16 to the controller 84.

With the foregoing in mind, when driving the self-emissive pixels 82 of the display 26, the gate driver circuit 30 may provide gate signals to each row of pixels 82 to enable the respective pixels 82 to receive pixel data via the driving lines $M_0, M_1, \ldots M_{n-1}$, and $M_n$. As the resolution of the display 26, the refresh rate used in the display 26, and the size (e.g., number of pixels) of the display 26 increases, the amount of time available (e.g., row time) for each row of pixels 82 to receive the respective gate signal decreases. As such, in some embodiments, the gate driver circuit 30 may overlap gate signals provided to different rows of pixels, as illustrated in FIG. 8.

Figure 8:
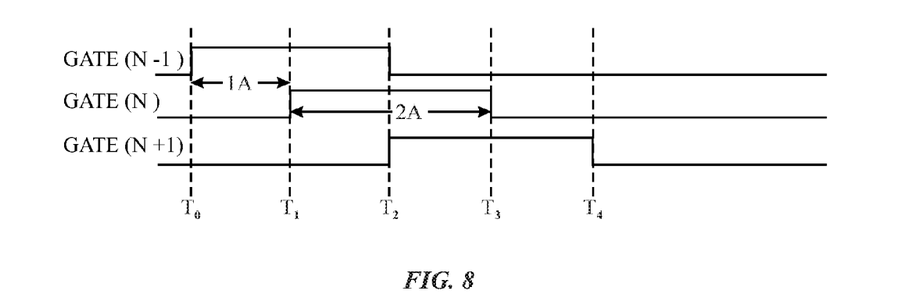
FIG. 8 is a timing diagram for providing overlapped gate signals to rows of pixels in a display of the electronic device of FIG. 1, in accordance with embodiments described herein.

As shown in FIG. 8, a first gate signal ($G_{N-1}$) may be provided between time to and time $t_2$ for a period of 2 H. The second gate signal ($G_N$) may be output during the second half of the first gate signal ($G_{N-1}$) between times $t_1$ and $t_3$. In the same manner, the third gate signal ($G_{N+1}$) may be provided during the second half of the second gate signal ($G_N$). By providing the gate signals in this overlapped fashion, the gate driver circuit 30 may use a portion of the time in which the preceding gate signal is active to pre-charge a node Q of a switch T1 (shown in FIG. 9) in the gate driver circuit 30 to enable the respective gate signal to be output by the gate driver circuit 30 at the appropriate time. That is, if the node Q of the switch T1 in the gate driver circuit 30 is not pre-charged prior to when a clock signal used to output the respective gate signal is received, the gate driver circuit 30 may not output the respective gate signal for the respective row of pixels for a sufficient amount of time to depict the respective image data.

Figure 9:
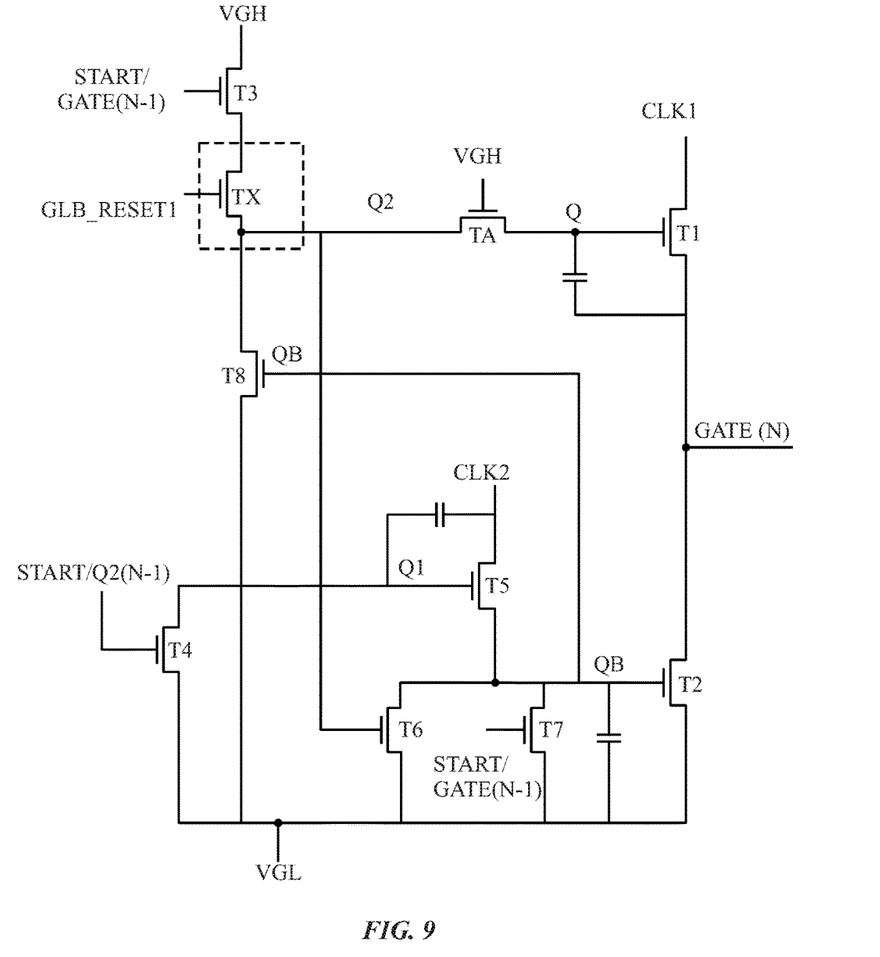
FIG. 9 is a circuit diagram of a gate driver circuit for providing a gate signal to a display of the electronic device of FIG. 1, in accordance with embodiments described herein.
Figure 10:
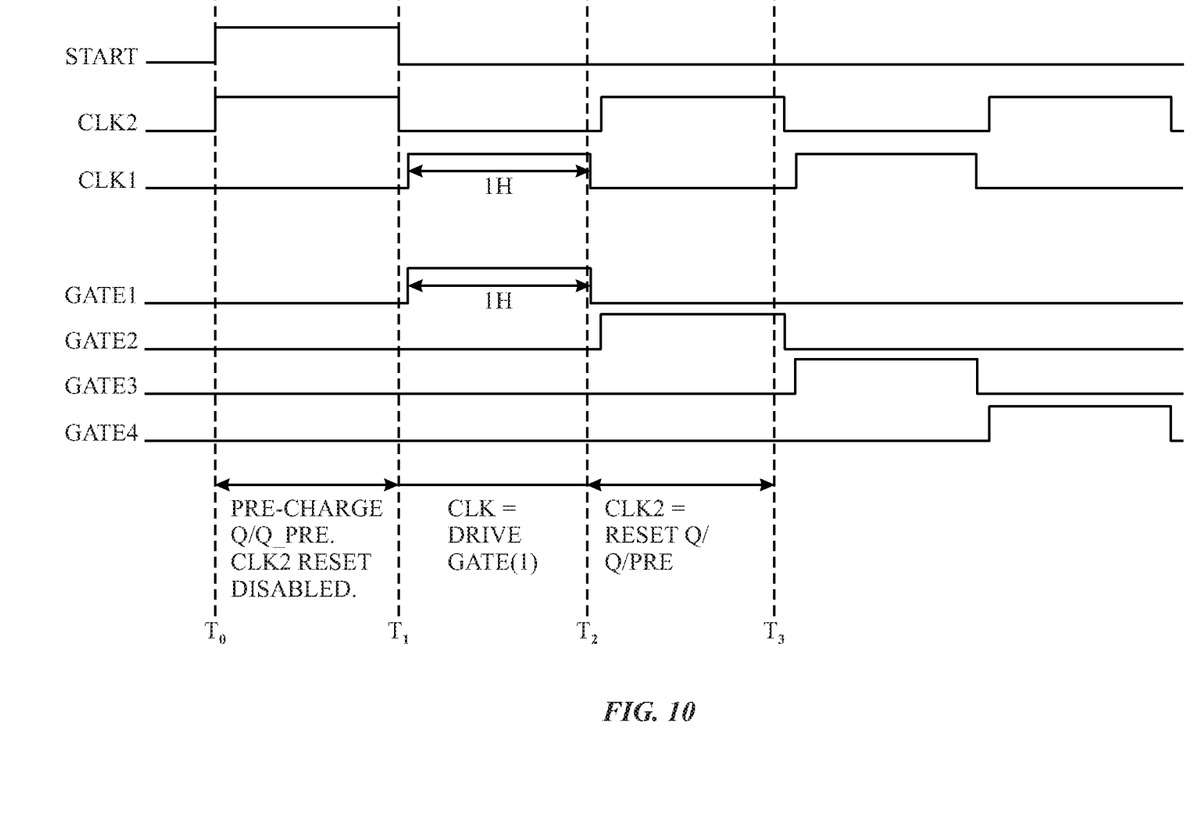
FIG. 10 is a timing diagram of gate signals output by gate driver circuits as provided in FIG. 9, in accordance with embodiments described herein.

With the foregoing in mind, FIG. 9 illustrates a circuit diagram of the gate driver circuit 30 that may pre-charge a node Q of a gate of a switch T1 using two clocks per gate-in-panel stage. Referring to FIG. 9, the gate driver circuit 30 includes a node Q that is coupled to the gate of the switch T1. When the node Q is charged to a voltage above some threshold, the switch T1 may activate and thus provide a conduction path across the switch T1. The switch T1, in one embodiment, is coupled to a first clock that provided a clock signal (CLK1) that switches between high and low according to some duty cycle. When the switch T1 is active and the first clock signal (CLK1) is high, the gate driver circuit 30 may output a corresponding gate signal (e.g., $G_1$).

To ensure that the node Q is pre-charged prior to the first clock signal (CLK1) is received, the gate driver circuit may initially receive a start signal (START) at a gate of switch T3 and thus connect a high voltage source (VGH) to the node Q. Referring briefly to the timing diagram of FIG. 10, the start signal (START) is provided to the switch T3 between times $t_0$ and $t_1$, while the first clock signal (CLK1) is low. However, by pre-charging the node Q prior to the first clock signal (CLK1) becoming active, the gate driver circuit 30 may ensure that the switch T1 is active and thus capable of using the first clock signal (CLK1) to output the gate signal (e.g., $G_1$) for the full duration of the first clock signal (CLK1).

After the first clock signal (CLK1) completes its first pulse at time $t_2$, a second clock signal (CLK2) from a second clock may start a pulse. Referring back to the circuit diagram of FIG. 9, when the second clock signal (CLK2) is high, switches T5 and T2 activate and thus discharges node Q. As such, at time $t_3$ when the first clock signal (CLK1) returns to a high state, the gate signal (e.g., $G_1$) remains low.

In certain embodiments, the gate signal (e.g., $G_1$) remains low until another start signal (START) is received or when a previous gate signal (e.g., $G_{n-1}$) becomes active. For the first gate signal G1 that corresponds to the first (e.g., topmost) row of pixels 82 of the display 26, the previous gate signal corresponds to the last (e.g., bottommost) row of pixels 82 of the display 26. In any case, when a gate signal associated with a previous gate driver circuit 30 becomes active, that gate signal (e.g., $GATE_{n-1}$) is provided to the switch T3 to pre-charge the node Q again to enable the gate driver circuit 30 to output the next gate signal for the respective row pixels during a subsequent frame of image data.

It should be noted that when the start signal (START) or the preceding gate signal ($GATE_{n-1}$) is received by the gate driver circuit 30, a switch $T_4$ is also activated to disable the second clock signal (CLK2) from interrupting the pre-charging of the node Q. That is, by activating switch $T_4$, the gate of switch $T_5$ is pulled to a low voltage source (VGL) and thus prevents the second clock signal (CLK2) from activating the switch $T_2$, which may pull the voltage of the node Q to the low voltage.

In certain embodiments, the gate of the switch $T_4$ may be coupled to a node Q_PRE, which is coupled to the high voltage source (VGH) when the preceding gate signal ($GATE_{n-1}$) is received at the gate of switch $T_3$. In addition, the node Q_PRE may also be coupled to a gate of a switch $T_6$, thereby keeping the gate of the switch $T_2$ low and preventing the switch $T_2$ from coupling the node Q to the low voltage source (VGL). In the same manner, the start signal (START) or the preceding gate signal ($GATE_{n-1}$) may be provided to a gate of switch $T_7$ to keep the gate of the switch $T_2$ low and prevent the switch $T_2$ from coupling the node Q to the low voltage source (VGL).

Each of the switches described above with respect to the gate driver circuit 30 may be any suitable electrical switch, such as a transistor, MOSFET, or the like. Additionally, although the circuit components of the gate driver circuit 30 is depicted with N-type switches, it should be noted that the switches may also be P-type devices. When using P-type devices, it should be noted that the polarity of the clock signals and the control signals are reversed.

Figure 11:
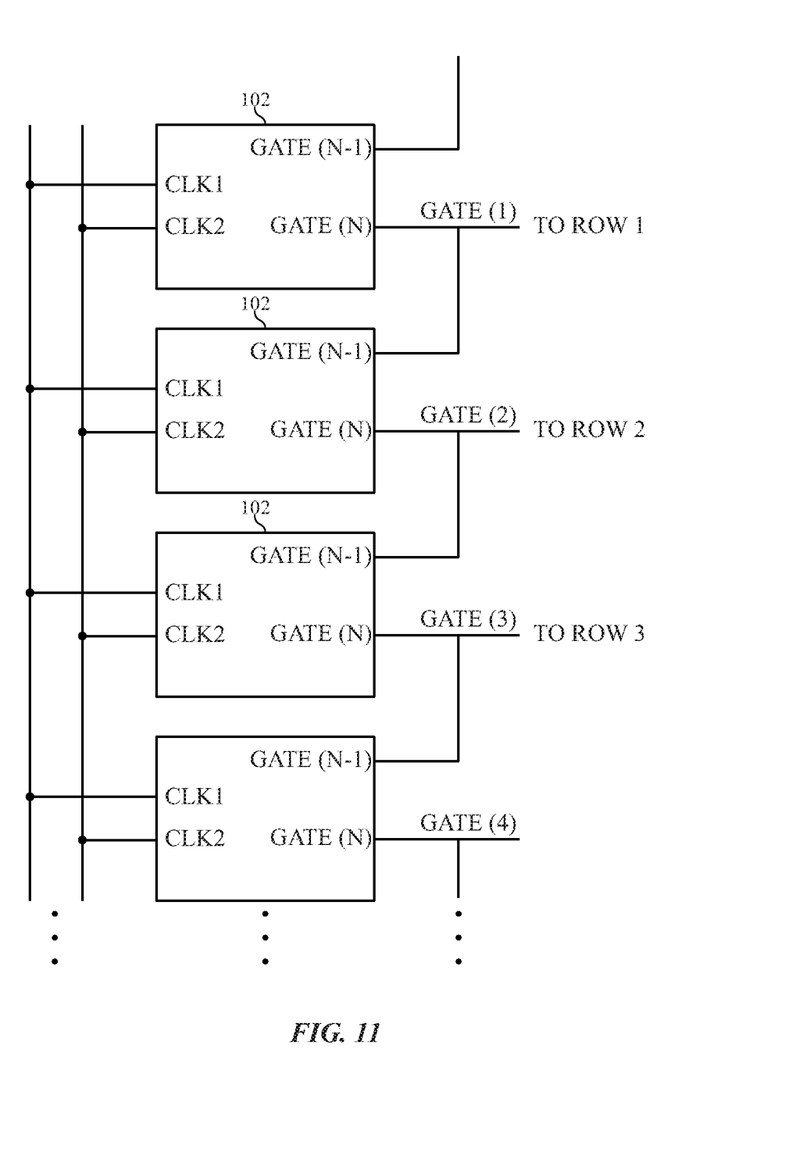
FIG. 11 is a circuit diagram of a number of gate driver circuits for providing a gate signal to a display of the electronic device of FIG. 1, in accordance with embodiments described herein.

With the foregoing in mind, FIG. 11 illustrates a block diagram depicting a number of gate driver circuits 30 and the manner in which each gate signal output is provided to another gate driver circuit 30. As shown in FIG. 11, a first gate driver circuit 102 may receive the start signal (START), which may be used to start the pre-charging of a respective node Q in the first gate driver circuit 102, as described above.

When the first gate driver circuit 102 outputs gate signal ($GATE_1$) to a first row of pixels 82, the gate signal ($GATE_1$) is also provided to a second gate driver circuit 104 that outputs a second gate signal ($GATE_2$) provided to a second row of pixels 82. The second gate driver circuit 104 may begin pre-charging its respective node Q when the first gate signal ($GATE_1$) is received according to the circuit operation described above with respect to FIG. 9. However, it should be noted that the clock inputs (CLK1 and CLK2) may be reversed for each adjacent gate driver circuit 30 of the display 26 to ensure that the respective gate signal ($G_N$) output by the respective gate driver circuit 30 does not interfere with another gate signal. That is, the first gate driver circuit 102 may receive clock signals (CLK1 and CLK2), as shown in FIG. 9. However, the next gate driver circuit 104 may receive clock signals (CLK2 and CLK1) in opposite positions, as compared to the circuit diagram of FIG. 9. This pattern in which the clock signals (CLK1 and CLK2) are connected to the remaining gate driver circuits would continue for the remaining number of gate driver circuits 30 of the display 26.

In any case, the gate signals of an adjacent gate driver circuit 30 may be used to coordinate the pre-charging of a respective node Q of each gate driver circuit 30 of the display 26. Since the gate drive signal of a preceding gate driver circuit 30 is used to initiate the pre-charge of a respective node Q, the gate driver circuit 30 avoids using an additional clock to control the pre-charge cycle of the gate driver circuit 30.

With the gate driver circuit 30 of FIG. 9 in mind, it should be noted that the gate signals do not overlap each other. As such, the number of clock phases (e.g., input clocks) for the gate driver circuit 30 may be determined as: n×H (e.g., driving clock time)+1 H (e.g., amount of time between pre-charge interval and receiving clock signal to output gate signal)=n+1, where n is a multiple of H and the product of n and H corresponds to an amount of time to drive the gate signal. That is, if the gate signal is to be provided for 1 H amount of time, the number of clocks for the gate driver circuit 30 is 1+1=2. In the same manner, if the gate signal is to be provided for 2 H amount of time, the number of clocks for the gate driver circuit 30 is 2+1=3.

Figure 12:
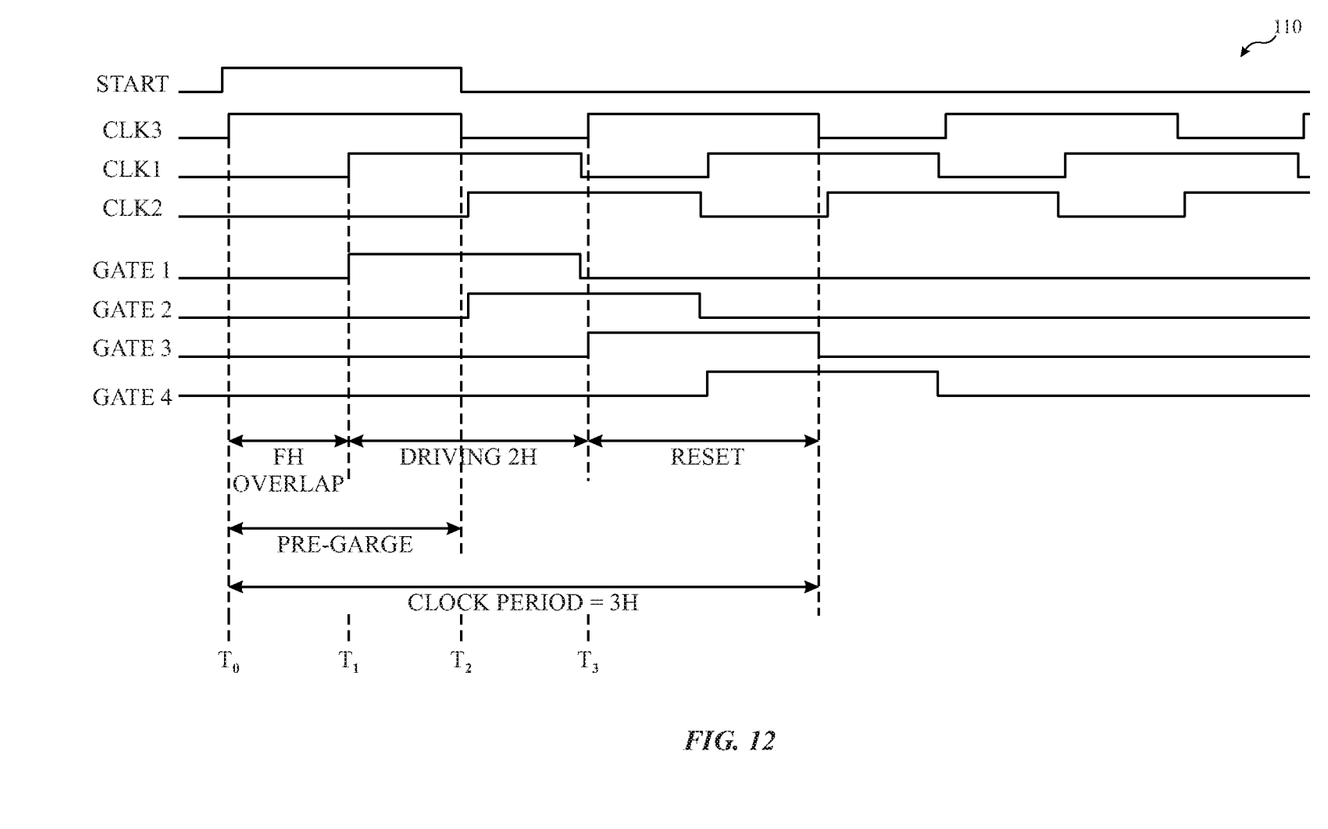
FIG. 12 is a timing diagram of gate signals output by gate driver circuits as provided in FIG. 9 using a three-phase clock signal, in accordance with embodiments described herein.

FIG. 12 illustrates a timing diagram 110 for a gate driver circuit 30 having a 2 H-driving period. To enable the gate driver circuit 30 to output the respective gate signal for 2 H amount of time when 1 H amount of time is used for pre-charging, the gate driver circuit 30 may overlap gate signals as illustrated in the timing diagram 110. To coordinate the operation of the gate driver circuits 30 of the display 26, each gate driver circuit 30 uses two clock inputs from a third clock signal (CLK3) and a first clock signal (CLK1), from the first clock signal (CLK1) and a second clock signal (CLK2), or the second clock signal (CLK2) and the clock signal (CLK3). That is, referring to the gate driver circuit 30 of FIG. 9 and the block diagram of gate driver circuits of FIG. 11, to coordinate the overlapping gate signals having a 2 H amount of time, the first gate driver circuit 102 may receive the first clock signal (CLK1) at the CLK1 input of the gate driver circuit 30 and receive the third clock signal (CLK3) at the CLK2 input of the gate driver circuit 30. The second gate driver circuit 104 may receive then receive the output from the first gate driver circuit 102 along with the second clock signal (CLK2) at the CLK1 input of the gate driver circuit 30 and receive the first clock signal (CLK1) at the CLK2 input of the gate driver circuit 30. The third gate driver circuit 106 may receive then receive the output from the second gate driver circuit 104 along with the first clock signal (CLK1) at the CLK1 input of the gate driver circuit 30 and receive the second clock signal (CLK2) at the CLK2 input of the gate driver circuit 30. This pattern may continue for the entire collection of gate driver circuits 30 of the display 26 to coordinate the overlapping of gate signals, as shown in FIG. 12.

By way of operation, according to the timing diagram 110, the node Q of the respective gate driver circuit 30 (e.g., gate driver circuit 102) may be pre-charged between times $t_0$ and $t_2$, while the start signal (START) is provided to the gate of the switch T3. Before time $t_1$, the node Q may be sufficiently charged to activate the switch T5, such that the first clock signal (CLK1) may be output as the first gate signal ($GATE_1$). The first gate signal ($GATE_1$) may then be provided to the second gate driver circuit 104 and may be used to initiate the pre-charging of the respective node Q of the second gate driver circuit 104. Before time $t_2$, the respective node Q of the second gate driver circuit 104 may be sufficiently charged to activate the respective switch T5, such that the second clock signal (CLK2) may be output as the second gate signal (GATE$_2$).

Figure 13:
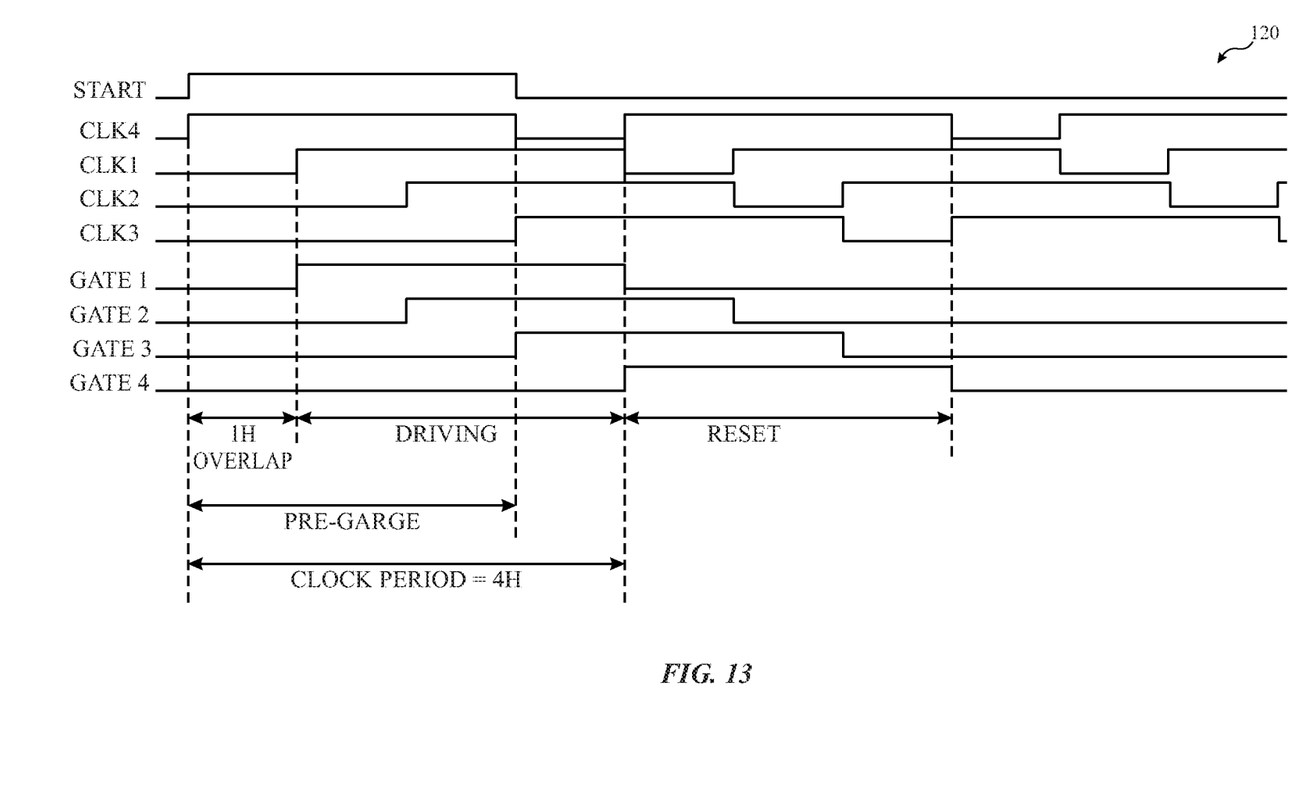
FIG. 13 is a timing diagram of gate signals output by gate driver circuits as provided in FIG. 9 using a four-phase clock signal, in accordance with embodiments described herein.
Figure 14:
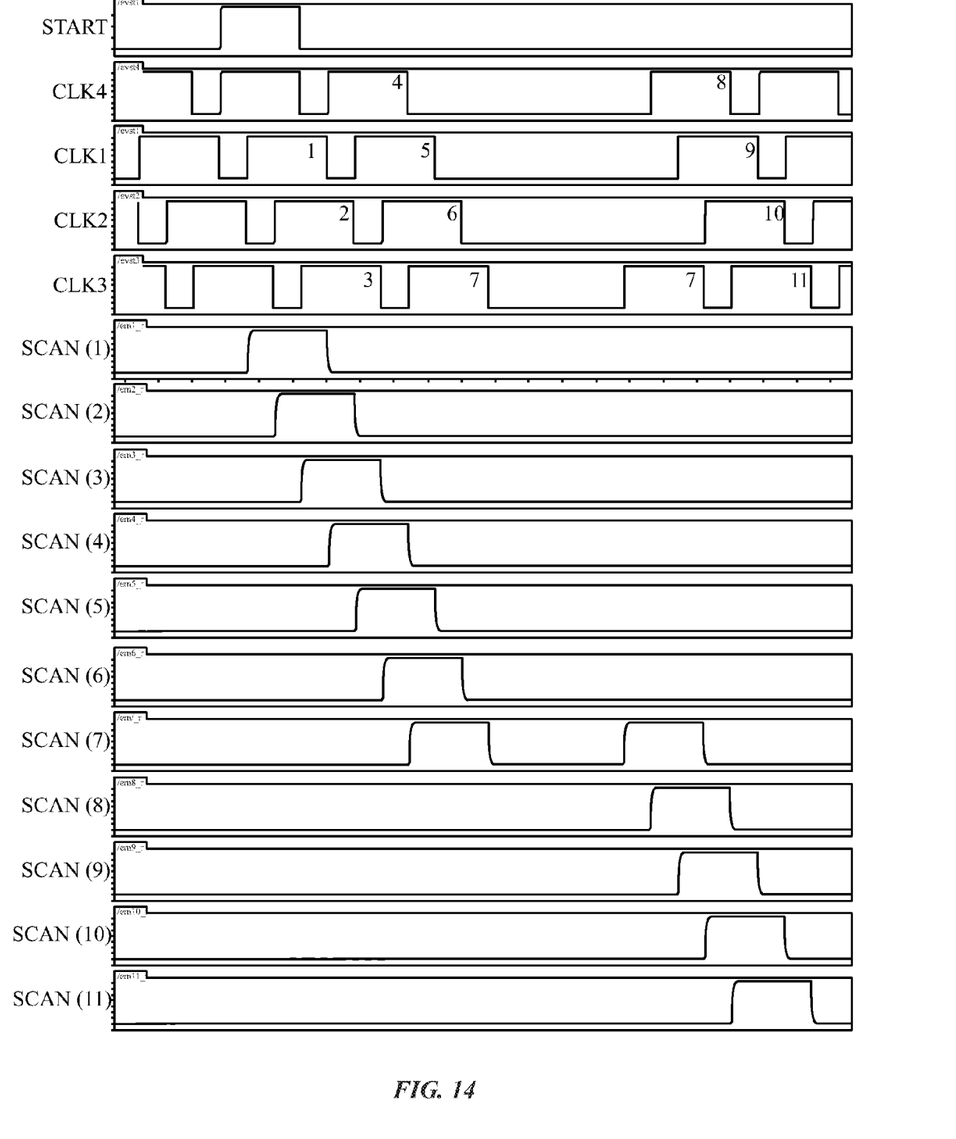
FIG. 14 is a timing diagram of gate signals output by gate driver circuits as provided in FIG. 9 to enable in-line sensing for pixels, in accordance with embodiments described herein.
Figure 15:
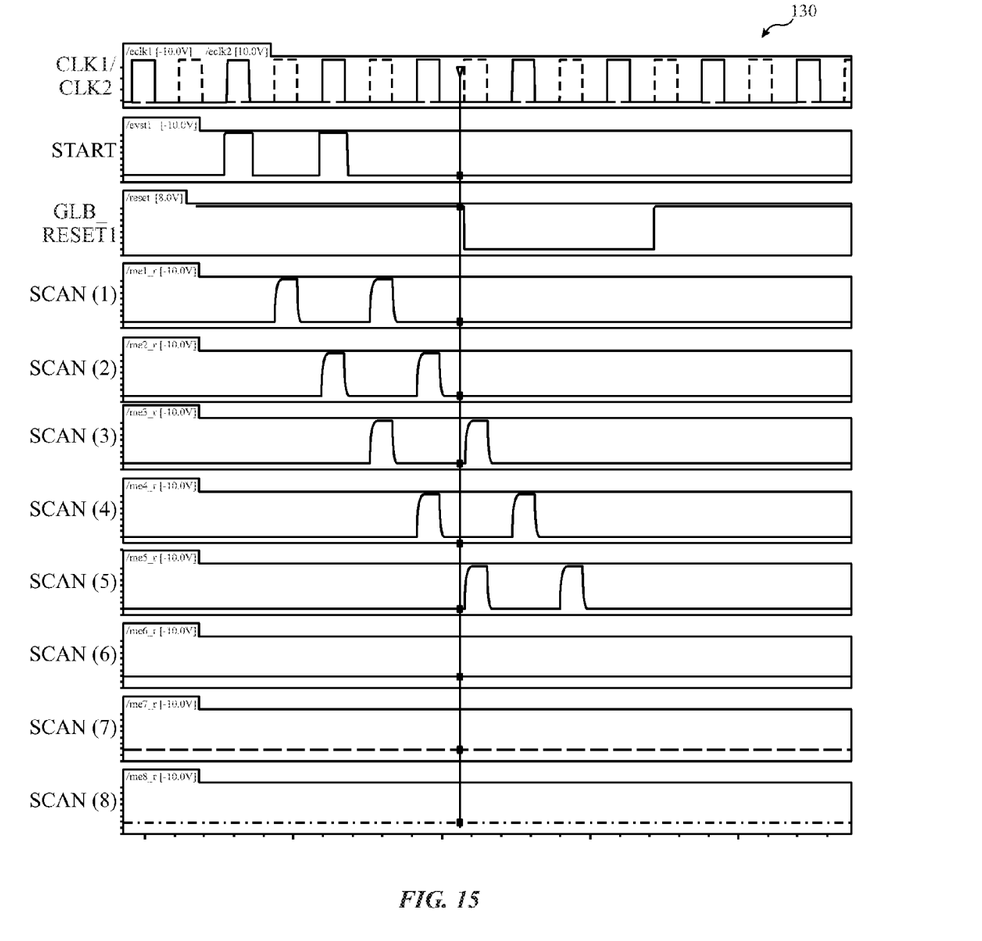
FIG. 15 is a timing diagram of a global reset signal provided to a gate driver circuit as provided in FIG. 9 to reset the operation of the gate driver circuit, in accordance with embodiments described herein.

With the foregoing in mind, FIG. 13 illustrates a timing diagram 120 for a 3 H gate driver circuit that operates according to the same manner as the 2 H gate driver circuit described above. As shown in FIG. 13, the 3 H gate driver circuit employs an additional clock (CLK4), such that each respective gate driver circuit 30 of the display uses at least 1 H amount of time to pre-charge the respective node Q.

In addition to coordinating overlapping gate signals, the gate driver circuit 30 may be manipulated to enable in-line voltage sensing of a pixel in any row of pixels 82. For instance, referring to FIG. 14, the third clock signal (CLK3) may be asserted twice before returning to a pattern of clock signals to provide two scan inputs at line 7. The first scan input may provide a sensing voltage to a pixel 82 and the second scan input may provide pixel data voltage to the pixel 82 that corresponds to the desired image data. The properties or reaction of the pixel 82 with respect to the sensing voltage may be monitored by some circuitry, which may determine a compensation voltage (or current) to provide the pixel 82 to ensure that the pixel 82 operates consistently with respect to other pixels 82 of the display 26.

In some instances, it may be beneficial to reset or interrupt the operation of the gate driver circuit 30. Referring back to the circuit diagram of the gate driver circuit 30 of FIG. 9, a reset signal (RESET) may be provided to a gate of a switch Tx to control the operation of the switch Tx. In one embodiment, the reset signal (RESET) may provide a high voltage signal while the gate driver circuit 30 is in operation. When the reset signal (RESET) is removed or switched to a low voltage signal, as depicted at time to in the timing diagram 130 of FIG. 15, the switch Tx may be opened, thereby precluding the ability of the node Q of gate driver circuits 30 that have not output a gate signal to pre-charge. As a result, the respective gate driver circuits 30 that do not pre-charge the respective node Q does not output a gate signal ($G_N$). Consequentially, each subsequent gate driver circuit 30 expecting to use the preceding gate signal to initiate the pre-charge of its respective node Q will not pre-charge its respective node Q. As a result, each of the gate driver circuits 30 of the display 26 eventually stops outputting gate signals ($G_N$), and the display 26 stops depicting image data. The gate driver circuits 30 will then continue to refrain from outputting gate signals ($G_N$) until the start signal (START) is received at switch T3 and switch T7, as described above.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display device, comprising:
   a plurality of rows of pixels configured to display image data on a display; and
   a first gate driver circuit configured to:
   couple a first voltage source to a first node associated with a first gate of a first switch upon receipt of a start signal or a gate signal from another gate driver circuit;
   couple a first clock signal to a first gate line via the first switch after a first voltage of the first node exceeds a threshold, wherein the threshold is associated with activating the first switch, wherein the first gate line is configured to couple to a first row of the plurality of rows of pixels; and
   couple a second voltage source to the first node based on a second clock signal, wherein the second voltage source is configured to discharge the first node.

2. The display device of claim 1, comprising a second gate driver circuit configured to couple the first voltage source to a second node associated with a second gate of a second switch of the second gate driver circuit upon receipt the first gate signal from the first gate driver circuit.

3. The display device of claim 2, wherein the second gate driver circuit is configured to couple the second clock signal to a second gate line via the second switch after a second voltage of the second node exceeds the threshold, wherein the second gate line is configured to couple to a second row of the plurality of rows of pixels.

4. The display device of claim 3, wherein the second gate driver circuit is configured to couple the second voltage source to the second node based on the first clock signal, wherein the second voltage source is configured to discharge the second node.

5. The display device of claim 1, comprising a second switch configured to couple the second voltage source to the first node based on the second clock signal.

6. The display device of claim 5, comprising a third switch configured to activate the second switch based on the start signal or an additional voltage from an additional node of another gate driver circuit.

7. The display device of claim 1, comprising a second switch configured to prevent the first node from coupling to the first voltage source based on a reset signal.

* * * * *

UNITED STATES PATENT AND TRADEMARK OFFICE
CERTIFICATE OF CORRECTION

PATENT NO. : 10,395,600 B2
APPLICATION NO. : 15/711706
DATED : August 27, 2019
INVENTOR(S) : Chin-Wei Lin et al.

Page 1 of 1

It is certified that error appears in the above-identified patent and that said Letters Patent is hereby corrected as shown below:

In the Claims

Claim 2, Column 12, Line 28, insert --of-- between "receipt" and "the".

Signed and Sealed this
Twenty-fourth Day of December, 2019

Andrei Iancu
*Director of the United States Patent and Trademark Office*